United States Patent
Ivanov

(10) Patent No.: US 8,502,381 B2
(45) Date of Patent: Aug. 6, 2013

(54) BARRIER LAYER CONFIGURATIONS AND METHODS FOR PROCESSING MICROELECTRONIC TOPOGRAPHIES HAVING BARRIER LAYERS

(75) Inventor: Igor C. Ivanov, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/013,187

(22) Filed: Jan. 25, 2011

(65) Prior Publication Data
US 2011/0117328 A1 May 19, 2011

Related U.S. Application Data

(62) Division of application No. 12/719,167, filed on Mar. 8, 2010, now Pat. No. 7,897,507, which is a division of application No. 11/199,621, filed on Aug. 9, 2005, now Pat. No. 7,714,441.

(60) Provisional application No. 60/599,975, filed on Aug. 9, 2004.

(51) Int. Cl.
*H01L 23/52* (2006.01)
*H01L 23/48* (2006.01)
*H01L 29/40* (2006.01)

(52) U.S. Cl.
USPC ............ 257/751; 257/E21.584; 257/758; 257/774; 438/627; 438/643; 438/653

(58) Field of Classification Search
USPC ............ 257/E21.174, E21.585, 758, 774, 257/762, 622, 751, E21.495, E21.021, E21.584, 257/E23.16; 438/625, 627, 678, 687, 643, 438/653, 927; 428/172
See application file for complete search history.

(56) References Cited

U.S. PATENT DOCUMENTS 4,224,381 A  9/1980 Patel et al.
4,278,046 A  7/1981 Clarke et al.
(Continued)

FOREIGN PATENT DOCUMENTS

FR  2816758  5/2002
JP  61-161175  7/1986
(Continued)

OTHER PUBLICATIONS

Hu et al., "Reduced electromigration of Cu wires by surface coating," Applied Physics Letters, vol. 81, No. 10, Sep. 2002, pp. 1782-1784.
(Continued)

*Primary Examiner* — Chris Chu
(74) *Attorney, Agent, or Firm* — Kevin L. Daffer; Mollie E. Lettang; Daffer McDaniel, LLP

(57) ABSTRACT

A microelectronic topography includes a dielectric layer (DL) with a surface higher than an adjacent bulk metal feature (BMF) and further includes a barrier layer (BL) upon the BMF and extending higher than the DL. Another microelectronic topography includes a BL with a metal-oxide layer having a metal element concentration which is disproportionate relative to concentrations of the element within metal alloy layers on either side of the metal-oxide layer. A method includes forming a BL upon a BMF such that portions of a first DL adjacent to the BMF are exposed, selectively depositing a second DL upon the BL, cleaning the topography thereafter, and blanket depositing a third DL upon the cleaned topography. Another method includes polishing a microelectronic topography such that a metallization layer is coplanar with a DL and further includes spraying a deionized water based fluid upon the polished topography to remove debris from the DL.

20 Claims, 7 Drawing Sheets

U.S. PATENT DOCUMENTS

| | | | |
|---|---|---|---|
| 4,594,995 A | | 6/1986 | Garrison |
| 4,659,587 A | | 4/1987 | Imura et al. |
| 4,982,694 A | | 1/1991 | Moriyama |
| 5,674,787 A | * | 10/1997 | Zhao et al. ............ 438/627 |
| 5,695,810 A | | 12/1997 | Dubin et al. |
| 5,798,903 A | | 8/1998 | Dhote et al. |
| 5,913,147 A | * | 6/1999 | Dubin et al. ............ 438/687 |
| 5,942,799 A | | 8/1999 | Danek et al. |
| 5,969,422 A | * | 10/1999 | Ting et al. ............ 257/762 |
| 5,976,928 A | | 11/1999 | Kirlin et al. |
| 6,017,437 A | | 1/2000 | Ting et al. |
| 6,248,168 B1 | | 6/2001 | Takeshita et al. |
| 6,249,055 B1 | * | 6/2001 | Dubin ............ 257/758 |
| 6,258,223 B1 | | 7/2001 | Cheung et al. |
| 6,267,853 B1 | | 7/2001 | Dordi et al. |
| 6,286,525 B1 | | 9/2001 | Nishimura et al. |
| 6,290,865 B1 | | 9/2001 | Lloyd et al. |
| 6,299,938 B1 | | 10/2001 | Tateyama |
| 6,326,287 B1 | | 12/2001 | Asahina et al. |
| 6,413,788 B1 | * | 7/2002 | Tuttle ............ 438/3 |
| 6,447,933 B1 | | 9/2002 | Wang et al. |
| 6,498,714 B1 | | 12/2002 | Fujisawa et al. |
| 6,548,844 B1 | | 4/2003 | Fukuzumi et al. |
| 6,570,325 B2 | | 5/2003 | Graff et al. |
| 6,597,027 B1 | | 7/2003 | Hashimoto et al. |
| 6,605,874 B2 | * | 8/2003 | Leu et al. ............ 257/758 |
| 6,624,075 B1 | * | 9/2003 | Lopatin et al. ............ 438/687 |
| 6,645,567 B2 | | 11/2003 | Chebiam et al. |
| 6,674,170 B1 | * | 1/2004 | Ngo et al. ............ 257/774 |
| 6,749,689 B2 | | 6/2004 | Greene et al. |
| 6,770,424 B2 | | 8/2004 | Mandal et al. |
| 6,824,612 B2 | | 11/2004 | Stevens et al. |
| 6,860,944 B2 | | 3/2005 | Ivanov et al. |
| 6,913,651 B2 | | 7/2005 | Ivanov et al. |
| 6,977,224 B2 | * | 12/2005 | Dubin et al. ............ 438/678 |
| 7,279,423 B2 | | 10/2007 | Johnston et al. |
| 7,387,131 B2 | | 6/2008 | Kuroda et al. |
| 7,396,759 B1 | * | 7/2008 | van Schravendijk et al. . 438/625 |
| 7,636,234 B2 | | 12/2009 | Ivanov |
| 7,714,441 B2 | | 5/2010 | Ivanov |
| 7,779,782 B2 | | 8/2010 | Ivanov |
| 7,884,033 B2 | | 2/2011 | Ivanov |
| 7,897,507 B2 | | 3/2011 | Ivanov |
| 2001/0003968 A1 | | 6/2001 | Kitano et al. |
| 2001/0018266 A1 | | 8/2001 | Jiang et al. |
| 2002/0043466 A1 | | 4/2002 | Dordi et al. |
| 2002/0088393 A1 | | 7/2002 | Kitano et al. |
| 2002/0167086 A1 | | 11/2002 | Stauf et al. |
| 2002/0176928 A1 | | 11/2002 | Minami et al. |
| 2003/0075808 A1 | | 4/2003 | Inoue et al. |
| 2003/0143837 A1 | | 7/2003 | Gandikota et al. |
| 2003/0172955 A1 | | 9/2003 | Kuroda et al. |
| 2003/0181040 A1 | | 9/2003 | Ivanov et al. |
| 2003/0209194 A1 | | 11/2003 | Amigh et al. |
| 2003/0209747 A1 | | 11/2003 | Hashimoto et al. |
| 2004/0038073 A1 | | 2/2004 | Chebiam et al. |
| 2004/0065540 A1 | | 4/2004 | Mayer et al. |
| 2004/0097071 A1 | | 5/2004 | Ivanov |
| 2004/0121596 A1 | | 6/2004 | Pan et al. |
| 2004/0216841 A1 | | 11/2004 | Ito et al. |
| 2004/0226654 A1 | | 11/2004 | Hongo et al. |
| 2004/0238960 A1 | | 12/2004 | Sukharev et al. |
| 2004/0248409 A1 | | 12/2004 | Padhi et al. |
| 2004/0250755 A1 | | 12/2004 | Ivanov et al. |
| 2005/0003654 A1 | * | 1/2005 | Horikoshi et al. ............ 438/627 |
| 2005/0029662 A1 | | 2/2005 | Nakano et al. |
| 2005/0160974 A1 | | 7/2005 | Ivanov et al. |
| 2005/0161338 A1 | * | 7/2005 | Fang et al. ............ 205/176 |
| 2005/0181135 A1 | | 8/2005 | Ivanov et al. |
| 2005/0181226 A1 | | 8/2005 | Weidman et al. |
| 2006/0029727 A1 | | 2/2006 | Ivanov |
| 2006/0029833 A1 | | 2/2006 | Ivanov |
| 2006/0030143 A1 | | 2/2006 | Ivanov |
| 2006/0030157 A1 | | 2/2006 | Ivanov |
| 2006/0051493 A1 | | 3/2006 | Tella et al. |
| 2007/0149429 A9 | | 6/2007 | Roeder et al. |
| 2011/0014489 A1 | | 1/2011 | Ivanov et al. |

FOREIGN PATENT DOCUMENTS

| | | |
|---|---|---|
| JP | 10-226888 | 8/1998 |
| JP | 2001020091 | 1/2001 |
| WO | 02/092877 | 11/2002 |

OTHER PUBLICATIONS

Patent Abstract of Japan, Publication No. 2004134667, published Apr. 30, 2004.

International Search Report, PCT/US2005/028119, mailed Apr. 21, 2006.

Hu et al., "Reduced Cu interface diffusion of CoWP surface coating," Microelectronic Engineering, vol. 70, 2003, pp. 406-411.

Shacham-Diamand et al., "Electroless Co(Mo,P) films for Cu interconnect application," Microelectronic Engineering, vol. 64, 2002, pp. 315-320.

International Search Report, PCT/US2005/028120, mailed Dec. 9, 2005.

Office Action mailed May 28, 2008 for U.S. Appl. No. 11/199,620.
Office Action mailed Jan. 6, 2009 for U.S. Appl. No. 11/199,620.
Final Office Action mailed Jul. 27, 2009 for U.S. Appl. No. 11/199,620.
Advisory Action mailed Nov. 2, 2009 for U.S. Appl. No. 11/199,620.
Examiner's Answer mailed Mar. 16, 2010 for U.S. Appl. No. 11/199,620.
Office Action mailed Mar. 31, 2009 for U.S. Appl. No. 11/200,324.
Final Office Action mailed Dec. 11, 2009 for U.S. Appl. No. 11/200,324.
Notice of Allowance mailed Apr. 19, 2010 for U.S. Appl. No. 11/200,324.
Office Action mailed Jan. 6, 2009 for U.S. Appl. No. 11/199,621.
Final Office Action mailed Jul. 29, 2009 for U.S. Appl. No. 11/199,621.
Notice of Allowance mailed Dec. 21, 2009 for U.S. Appl. No. 11/199,621.
Office Action mailed Sep. 10, 2008 for U.S. Appl. No. 11/199,657.
Office Action mailed Mar. 10, 2009 for U.S. Appl. No. 11/199,657.
Notice of Allowance mailed Aug. 25, 2009 for U.S. Appl. No. 11/199,657.
Notice of Allowance mailed Sep. 29, 2010 for U.S. Appl. No. 12/616,367.
Notice of Allowance mailed Nov. 22, 2010 for U.S. Appl. No. 12/719,167.
Board of Patent Appeals & Interferences Decision mailed Apr. 27, 2012 for U.S. Appl. No. 11/199,620.
Office Action mailed Jan. 11, 2012 for U.S. Appl. No. 12/838,607.
Final Office Action mailed Aug. 10, 2012 for U.S. Appl. No. 12/838,607.
Office Action mailed Jan. 19, 2012 for U.S. Appl. No. 12/838,643.
Office Action mailed Apr. 15, 2011 for U.S. Appl. No. 12/980,518.
Notice of Allowance mailed Nov. 23, 2011 for U.S. Appl. No. 12/980,518.
Zhang et al., "In situ resistivity study of copper-cobalt films: precipitation, dissolution and phase transformation," Thin Solid Films, vol. 401, 2001, pp. 298-305.
Final Office Action mailed Sep. 25, 2012 for U.S. Appl. No. 12/838,643.

* cited by examiner under BARRIER LAYER CONFIGURATIONS AND
METHODS FOR PROCESSING
MICROELECTRONIC TOPOGRAPHIES
HAVING BARRIER LAYERS

CONTINUING DATA

The present application is a divisional from U.S. application Ser. No. 12/719,167 filed Mar. 8, 2010 which claims priority to U.S. application Ser. No. 11/199,621 filed Aug. 9, 2005 which claims priority to U.S. Provisional Application No. 60/599,975 filed Aug. 9, 2004.

BACKGROUND OF THE INVENTION

1. Field of the Invention

This invention generally relates to methods and configurations of microelectronic topography fabrications and, more particularly, to methods and configurations of microelectronic topography fabrications having a barrier layer formed therein.

2. Description of the Related Art

The following descriptions and examples are not admitted to be prior art by virtue of their inclusion within this section.

In some microelectronic devices, a metallization structure may include, in addition to a bulk metal feature, one or more barrier layers arranged above, below, and/or along the sides of the bulk metal feature to prevent elements within the bulk metal feature from diffusing to underlying and/or overlying layers of the topography. Although conventional barrier layers are generally sufficient to inhibit most elemental diffusion from a bulk metal feature, some diffusion may still occur. For example, copper atoms are particularly notorious for being able to migrate through barrier layers. The migrated copper atoms can potentially be exposed to oxidation or moisture at the surface of the barrier layer or may tunnel through silicon materials disposed adjacent to the barrier layer, affecting the reliability of the device and, in some cases, causing the device to malfunction. A further deficiency of conventional barrier layers is that an agglomeration of vacancies at weak interfaces between the bulk metal feature and the barrier layers may be induced by stresses within the barrier layers. In particular, barrier layers formed having compressive stress may undesirably cause hillocks to form within the barrier layer structure, causing nonplanarity within the upper surface of the barrier layer. Alternatively, barrier layers formed having tensile stress may potentially result in delamination of the barrier layer from the bulk metal feature.

The addition of barrier layers may also complicate the fabrication of a device, incurring increased process steps, processing time, and costs. For instance, additional steps, such as cleaning contamination from the topography, may be needed prior to or subsequent to the fabrication of a barrier layer to inhibit undesirable effects to the functionality of the device. In particular, a barrier layer may become oxidized in between processes subsequent to deposition in some embodiments. Removal of such oxidation to prevent an increase in resistivity of the metallization structure, however, may cause the surface of the barrier layer to be etched, removing particles of the barrier layer. In some cases, the particles of the barrier layer may cause further debris by depositing on to the interlevel dielectric surface adjacent to the metallization structure. In addition or alternatively, small fragments of the bulk metal layer may be formed upon an adjacent dielectric layer, such as in embodiments in which the bulk metal feature is polished to be confined within sidewalls of the dielectric layer. In any case, the residual particles may be sealed with the deposition of an overlying interlevel dielectric, possibly incurring leakage current at a higher voltage potential.

The problem of the small metal fragments on the dielectric layer adjacent to the bulk metal feature may be further compounded when electroless deposition techniques are used to selectively deposit a barrier layer on the bulk metal feature. Electroless deposition (also referred to herein as "electroless plating") is a process for depositing materials on a catalytic surface from an electrolyte solution without an external source of current. An advantage of an electroless plating process is that it can be selective, i.e., the material can be deposited only onto areas that demonstrate appropriate chemical properties. In particular, local deposition can be performed onto metals that exhibit an affinity to the material being deposited or onto areas pretreated or pre-activated, e.g., with a catalyst. Any residual fragments on surfaces of an adjacent dielectric layer may be catalytic to the electroless deposition of the barrier layer or may attract a catalytic seed layer used to electrolessly deposit the barrier layer. In either case, portions of the barrier layer may be undesirably deposited upon the adjacent dielectric structure, potentially causing a short within the circuit.

Some methods for removing metal residue upon a dielectric surface may include etching the dielectric with hydrofluoric acid and/or a brush scrub. Such methods, however, have a tendency to damage the metal layers on the topography. In addition, hydrofluoric acid cleaning is generally only constructive for cleaning silicon-oxide based interlevel dielectrics which do not have a low dielectric constant (k). In particular, low-k dielectric materials (referred to herein as dielectric materials having a dielectric constant less than approximately 3.5) are generally porous and, therefore, may undesirably retain hydrofluoric acid during a cleaning process, which may in turn cause the dielectric layer to deteriorate in time. In addition, carbon-based low-k dielectric materials are generally resistant to cleaning by hydrofluoric acid. Consequently, as the use of low-k dielectric materials become more prevalent within microelectronic topographies, such cleaning techniques may be insufficient.

It would, therefore, be desirable to develop methods for removing metallic particles from dielectric surfaces while avoiding the aforementioned problems. In addition, it would be beneficial to inhibit the formation of metallic debris during the fabrication of a metallization structure. Furthermore, it would be advantageous to develop barrier layer configurations which inhibit a greater degree of elemental diffusion from overlying and/or underlying metal features than provided by conventional barrier layers. Moreover, it would be desirable to develop a barrier layer configuration which is less susceptible to hillock formation or delamination.

SUMMARY OF THE INVENTION

The problems outlined above may be in large part addressed by improved configurations of barrier layers and methods for processing microelectronic topographies having barrier layers. The following are mere exemplary embodiments of the methods and microelectronic topographies and are not to be construed in any way to limit the subject matter of the claims.

An embodiment of one of the microelectronic topographies includes a dielectric layer arranged adjacent to opposing sidewalls of a bulk metal feature. The dielectric layer comprises an upper surface at an elevation higher than an upper surface of the bulk metal feature. The microelectronic topography further includes a diffusion barrier layer formed upon and in contact with the upper surface of the bulk metal feature extending to an elevation higher than the upper surface of the dielectric layer.

An embodiment of another of the microelectronic topographies includes a barrier layer formed in contact with a bulk metal feature which includes a first metal element. The barrier layer includes a plurality of metal alloy layers each having a metal constituent majority different than the bulk metal feature. In addition, the barrier layer includes a metal-oxide compound layer interposed between two of the plurality of metal alloy layers, which has a disproportionate concentration of the first metal element relative to concentrations of the first metal element within the plurality of metal alloy layers.

An embodiment of one of the methods includes forming a diffusion barrier layer upon and in contact with a bulk metal feature such that portions of a first dielectric layer arranged adjacent to the bulk metal feature are exposed. The method further includes selectively depositing a second dielectric layer upon and in contact with the diffusion barrier layer and cleaning the microelectronic topography thereafter. Moreover, the method includes blanket depositing a third dielectric layer upon the cleaned microelectronic topography.

An embodiment of another of the methods includes polishing the microelectronic topography such that a metallization layer is substantially coplanar with an adjacent dielectric layer and spraying a deionized water based solution upon the polished microelectronic topography to remove organic debris from the upper surface of the adjacent dielectric layer. The spraying process is conducted at a pressure greater than approximately 10 psi, at a temperature between approximately 75° C. and approximately 95° C., and at an angle between approximately 10° and approximately 80° relative to the polished surface of the microelectronic topography.

BRIEF DESCRIPTION OF THE DRAWINGS

Other objects and advantages of the invention will become apparent upon reading the following detailed description and upon reference to the accompanying drawings in which.

Figure 1:
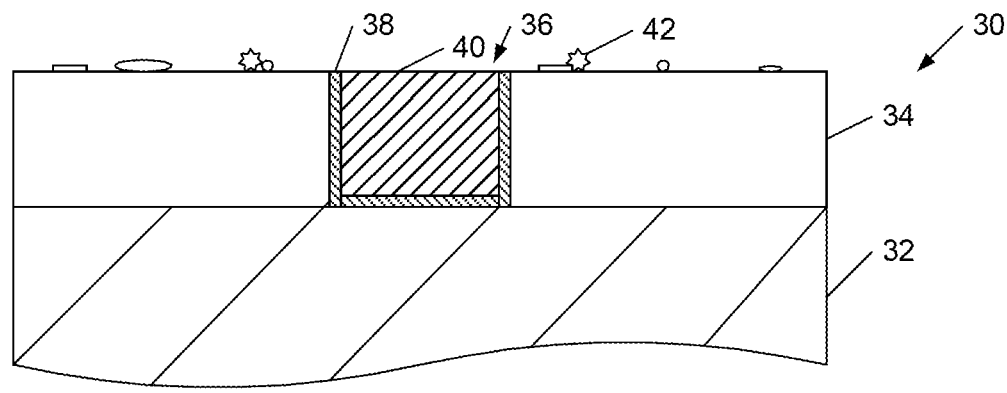
FIG. 1 depicts a partial cross-sectional view of a microelectronic topography having a bulk metal feature substantially coplanar with an adjacent dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary methods for processing a microelectronic topography prior to and/or subsequent to the formation of a barrier layer upon a bulk metal feature are provided in FIGS. 1-16. In addition, exemplary configurations of barrier layers are provided in FIGS. 16-18. FIG. 1 illustrates a partial cross-sectional view of microelectronic topography 30 having metallization structure 36 disposed above lower layer 32 and interposed within dielectric layer 34. In some embodiments, metallization structure 36 may include bulk metal feature 40 and liner layer 38 lining the surfaces of bulk metal feature as shown in FIG. 1. In such cases, liner layer 38 may be configured to reduce the diffusion of elements from bulk metal feature 40 to lower layer 32 and dielectric layer 34, reducing electromigration within an ensuing device. As such, liner layer 38 may generally be referred to as a barrier layer, but such a reference does not necessarily infer the exclusivity of diffusion barrier properties. In particular, liner layer 38 may additionally or alternatively serve as adhesion layers and/or thermal expansion buffers. An exemplary range of thickness for liner layer 38 may be between approximately 20 angstroms and approximately 100 angstroms, but smaller or larger thicknesses may be employed. In general, liner layer 38 may include any material composition that is configured for blocking the diffusion of elements. Some exemplary compositions that may be used for liner layer 38 are described in more detail below in reference to FIG. 3 with regard to the formation of cap layer 46. Another exemplary elemental composition for liner layer 38 is also described in reference to FIGS. 17 and 18. In yet other embodiments, liner layer 38 may be omitted from metallization structure 36.

In general, the term "microelectronic topography" may refer to a substrate resulting from or used for the fabrication of a microelectronic device or circuit, such as an integrated circuit, for example. As such, metallization structure 36 may be any metal feature known for the fabrication of a microelectronic device. For example, metallization structure 36 may, in some embodiments, serve as a contact structure to underlying portions of a semiconductor layer. In such cases, lower layer 32 may include a semiconductor material, such as silicon and may, in some embodiments, be doped either n-type or p-type. More specifically, lower layer 32 may be a monocrystalline silicon substrate or an epitaxial silicon layer grown on a monocrystalline silicon substrate. In addition or alternatively, lower layer 32 may include a silicon on insulator (SOI) layer, which may be formed upon a silicon wafer. In other cases, lower layer 32 may include metallization and/or an interlevel dielectric layer. In such embodiments, metallization structure 36 may serve as a via, an interconnect, or any other metallization feature providing an electrical path to portions of microelectronic topography 30.

In any case, bulk metal feature 40 may include one or more layers of conductive materials, including but not limited to copper, aluminum, tungsten, titanium, silver, or any alloy of such metals. As used herein, the term, "bulk metal feature" may generally refer to a structure include a majority concentration of metallic elements and, in some cases, consisting essentially of metallic elements. In some cases, bulk metal feature 40 may include a bulk concentration of a single metallic element. For example, in some embodiments, the methods and structures described herein may be particularly applicable to microelectronic topographies including a bulk metal feature having a majority concentration of copper and, in some cases, consisting essentially of copper. In particular, copper has a relatively low resistivity and, therefore, is often favorable to use for metallization structures in microelectronic devices. In some embodiments, bulk metal feature 40 may be fabricated by electroless plating techniques. In other embodiments, bulk metal feature 40 may be formed by other deposition techniques, such as but not limited to sputtering or evaporation. In either case, bulk metal feature 40 may, in some embodiments, be formed within a trench formed within dielectric layer 34. Such a fabrication sequence may be particularly advantageous for the incorporation of liner layer 38 within microelectronic topography 30. In other embodiments, dielectric layer 34 may be formed subsequent to and about bulk metal feature 40.

Dielectric layer 34 may include one or more of various dielectric materials used in microelectronic fabrication. For example, dielectric layer 34 may include silicon dioxide ($SiO_2$), silicon nitride ($Si_xN_y$), silicon dioxide/silicon nitride/silicon dioxide (ONO), silicon carbide, carbon-doped $SiO_2$, or carbonated polymers. In some cases, dielectric layer 34 may be undoped. Alternatively, dielectric layer 34 may be doped to form, for example, low doped borophosphorus silicate glass (BPSG), low doped phosphorus silicate glass (PSG), or fluorinated silicate glass (FSG). In some embodiments, dielectric layer 34 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. Other low-k dielectric materials, which may be used for dielectric layer 34, may include carbon-based low-k dielectric materials. In any case, dielectric layer 34 may have a thickness between approximately 2,000 angstroms and approximately 10,000 angstroms. Larger or smaller thicknesses of dielectric layer 34, however, may be appropriate depending on the microelectronic device being formed.

As shown in FIG. 1, microelectronic topography 30 may, in some embodiments, include metallic residue 42 arranged upon dielectric layer 34. Such a residue may, in some cases, be the result of polishing microelectronic topography 30, either by chemical-mechanical polishing (CMP) techniques or fixed abrasive techniques, such that metallization structure 36 is substantially coplanar with dielectric layer 34. In particular, a polishing process of microelectronic topography 30 may remove upper surface portions of bulk metal feature 40 and/or liner layer 38 and dump resulting particles upon dielectric layer 38. Although not shown to simplify the drawing of FIG. 1, non-metallic debris may additionally be formed upon microelectronic topography 30 from such a polishing process. The other debris may include but is not limited to particulates from dielectric layer 34, particulates from the slurry or polishing pad of the polishing process, or any other byproduct organic matter from the polishing process.

As noted above, the presence of such metallic particulate over dielectric materials may hinder the selective deposition of a barrier layer upon adjacent metallization structures when the barrier layer is formed by electroless plating techniques. In particular, portions of an ensuing barrier layer may be undesirably deposited upon the dielectric layer, potentially causing a short within the device. As such, it may be advantageous to remove metallic residue 42 in some embodiments. Another motive for removing metallic residue 42 as well as any other debris on microelectronic topography 30 may be to form a clean surface upon which to form additional layers. Such a rationalization may apply for embodiments in which a subsequent barrier layer is deposited using any type of deposition technique, including but not limited to electroless plating.

Figure 2:
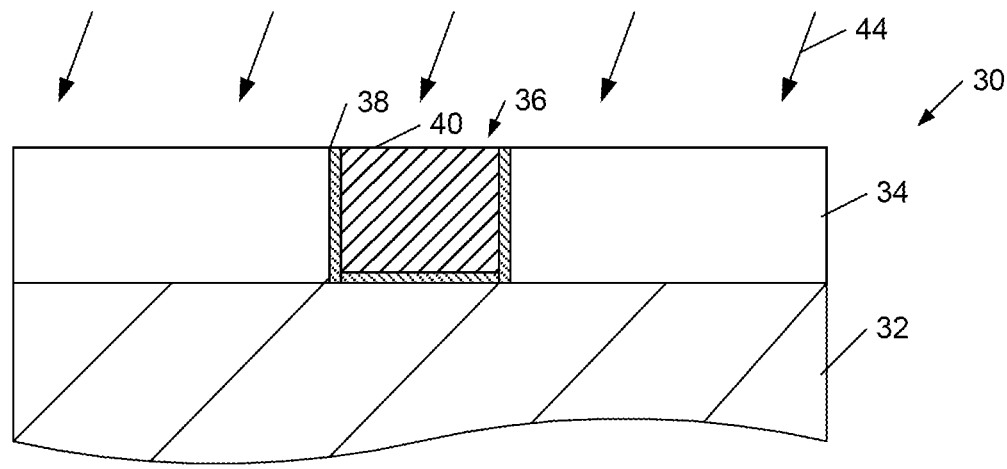
FIG. 2 depicts a partial cross-sectional view of the microelectronic topography in which a cleaning process is used to remove the debris shown upon the dielectric layer in FIG. 1.

An exemplary process for removing metallic residue 42 from microelectronic topography 30 is shown in FIG. 2. In particular, FIG. 2 illustrates the use of high-pressure, high-temperature deionized water based spray 44 to remove metallic residue 42 as well as other debris formed upon microelectronic topography 30. In general, the pressure of high-pressure, high temperature deionized water based spray 44 may be applied at a pressure greater than approximately 10 psi, and in some embodiments, between approximately 10 psi and approximately 25 psi. Higher pressures may be advantageous for applying the spray at a sufficient force to dislodge the metallic particulate, but lower pressures may be needed to avoid disfiguring the surface topology of the materials at the upper surface of microelectronic topography 30. In any case, high-pressure, high temperature deionized water based spray 44 may be additionally applied at a temperature between approximately 75° C. and approximately 95° C., and in some embodiments, more specifically between approximately 87° C. and approximately 92° C. The selected temperature may be based upon characteristics of the exposed materials of microelectronic topography 30 not to alter the surface topology of such materials.

Moreover, high-pressure, high temperature deionized water based spray 44 may be applied at an angle between approximately 10° and approximately 80° relative to the surface of microelectronic topography 30, and in some embodiments, between approximately 10° and approximately 50°. Such an angled spray may advantageously increase the amount of metallic particulate removed during the cleaning process as compared to conventional applications in which a cleaning fluid is applied at an angle 90° relative to the surface of the microelectronic topography. In some embodiments, the spray may be varied among a plurality of different angles during a cleaning process. In such cases, the spray bar used for the cleaning process may be programmably configured to change the angle at which the cleaning fluid is dispensed relative to the upper surface of the microelectronic topography. Alternatively, the spray may be applied at a fixed angle during the cleaning process. In either case, the spray may be intermittent, pulsed or continuous during the cleaning process.

In some embodiments, the deionized water based solution may include a phosphoric acid adsorbent, such as but not limited to tungsten phosphoric acid or nickel phosphoric acid. Such an additive may advantageously instigate a reaction with metallic residue 42, reducing the residue to smaller sized matter that may be more easily removed from the surface of dielectric layer 34. In general, the concentration of the phosphoric acid adsorbent within the deionized water based solution may be sufficient to facilitate a reaction with metallic residue 44 but low enough to prevent degradation of dielectric layer 34. An exemplary concentration range of the phosphoric acid adsorbent within the deionized water based solution may be between approximately 100 ppm and approximately 500 ppm, but smaller or larger concentrations may be used, depending on the material compositions of dielectric layer 34 and metallization structure 36.

It is noted that the method described herein is not necessarily restricted to the use of high-pressure, high temperature deionized water based spray 44 for the removal of metallic residue 42 from microelectronic topography 30. In particular, other cleaning processes may be used. For example, metallic residue 42 may be removed with a low-pressure, low temperature dispensing of hydrofluoric acid and/or a brush scrub. As noted above, however, such methods have a tendency to damage metal layers on the topography. In addition, hydrofluoric acid cleaning is generally only constructive for cleaning silicon-oxide based interlevel dielectrics that do not have a low dielectric constant (k). In particular, low-k dielectric materials are generally porous and, therefore, may undesirably retain hydrofluoric acid during a cleaning process, which may in turn cause the dielectric layer to deteriorate in time. In addition, carbon-based low-k dielectric materials are generally resistant to cleaning by hydrofluoric acid. As such, when dielectric layer 34 includes a low-k dielectric material, it may be advantageous to employ high-pressure, high temperature deionized water based spray 44 for the removal of metallic residue 42 from microelectronic topography 30, regardless of the manner in which a subsequent barrier layer is formed. In yet other embodiments, metallic residue 42 may not be removed prior to the deposition of an overlying layer and, as such, the process described in reference to FIG. 2 may be omitted from the fabrication sequence in some cases. An exemplary sequence of steps, which does not remove metallic residue from an upper surface of a dielectric layer prior to deposition of an overlying layer, is shown in FIGS. 10-14 and described in more detail below.

Figure 3:
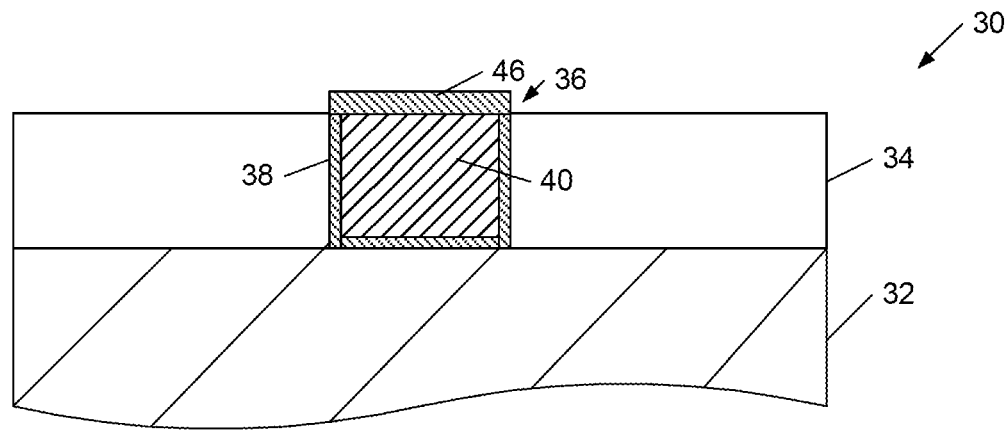
FIG. 3 depicts a partial cross-sectional view of the microelectronic topography in which a barrier layer is formed upon the bulk metal feature subsequent to the cleaning process shown in FIG. 2.

Turning to FIG. 3, cap layer 46 may be formed upon metallization structure 36, becoming an additional component of the structure. In general, cap layer 46 may be formed by any technique known in the microelectronic fabrication industry. In particular, cap layer 46 may, in some embodiments, be formed by blanking depositing a diffusion barrier material upon microelectronic topography 30 and patterning the blanket deposition of material by lithography techniques known in the microelectronic fabrication industry to form cap layer 46 directly over metallization structure 36. Alternatively, cap layer 46 may be selectively deposited upon metallization structure 36 using, for example, electroless plating techniques. In such cases, since metallic residue 42 was removed from dielectric layer 34 prior to the formation of cap layer 46, fragments of the barrier layer material may not be deposited upon the dielectric layer, averting the formation of shorts within the circuit. In general, the formation of cap layer 46 by electroless deposition techniques may follow any sequence of steps and include any collections of solutions known to those in the microelectronic industry for such an application.

Similar to liner layer 38, cap layer 46 may be configured to reduce the diffusion of elements from bulk metal feature 40, particularly to any layers formed above bulk metal feature 40. As a consequence, electromigration within an ensuing device may be reduced. In addition, cap layer 46 may be configured to prevent oxidation of metallization structure 36. As with liner layer 38, cap layer 46 may generally be referred to as a barrier layer, but such a reference does not necessarily infer the exclusivity of diffusion barrier properties. In particular, cap layer 46 may additionally or alternatively serve as adhesion layers and/or thermal expansion buffers. Since liner layer 38 and cap layer 46 may be configured to reduce the diffusion of elements from bulk metal feature 40, the selection and arrangement of the elements included within liner layer 38 and cap layer 46 may, in some embodiments, depend on the elements included in bulk metal feature 40. For example, in embodiments in which bulk metal feature 40 includes copper, the inclusion of cobalt within liner layer 38 and cap layer 46 may be particularly beneficial since copper has relatively low solubility with cobalt. Other materials that may be additionally or alternatively included within liner layer 38 and cap layer 46 may include phosphorus, boron, tungsten, chromium, molybdenum, nickel, palladium, rhodium, ruthenium, hydrogen, and oxygen.

Exemplary alloys that may be employed for liner layer 38 and cap layer 46 include but are not limited to cobalt-tungsten-phosphorus (CoWP), cobalt-tungsten-boron (CoWB), cobalt-tungsten-phosphorus-boron (CoWPB), cobalt-molybdenum-boron (CoMoB), cobalt-molybdenum-phosphorus (CoMoP), cobalt-molybdenum-chromium (CoMoCr), and cobalt-molybdenum-chromium-boron (CoMoCrB). In other embodiments, liner layer 38 and/or cap layer 46 may include single element layers of palladium, rhodium and ruthenium. It is noted that although hydrogen is not listed as an element with such exemplary materials, it may be incorporated therein as a result of electroless plating processes. In particular, hydrogen atoms may be lodged with a deposited film due to hydrogen outgassing of the electroless plating chemistry.

In some embodiments, liner layer 38 and/or cap layer 46 may include a relatively consistent concentration of elements through the layer. In other embodiments, however, liner layer 38 and/or cap layer 46 may include a variation of elemental concentrations throughout the layers to reduce the diffusion of elements from metallization structure 36 therethrough. In particular, liner layer 38 and/or cap layer 46 may include different concentrations of elements in different regions of the layer. Exemplary elemental compositions of barrier layers having a variation of elemental concentration throughout the layers and methods for depositing such layers are described in U.S. patent application Ser. No. 11/166,620 which was filed on Aug. 9, 2005 and is incorporated by reference as if fully set forth herein. Another exemplary elemental composition for a barrier layer is described in reference to FIGS. 17 and 18. In any case, liner layer 29 and cap layer 46 may, in some embodiments, include the same collection of elements and, in some cases, a similar arrangement of elements. Alternatively, liner layer 29 and cap layer 46 may include different arrangements of elements and, in some embodiments, a different collection of elements. An exemplary range of thickness for cap layer 46 may be between approximately 20 angstroms and approximately 200 angstroms, but smaller or larger thicknesses may be employed.

Figure 4:
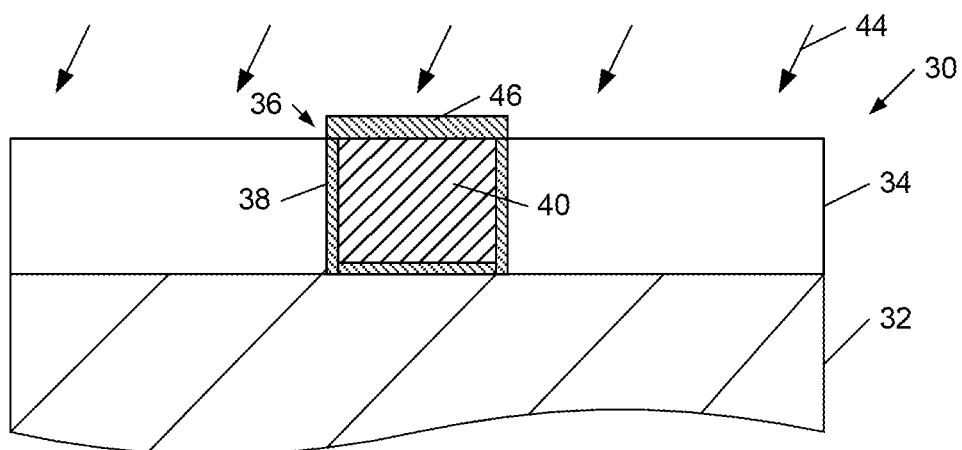
FIG. 4 depicts a partial cross-sectional view of the microelectronic topography in which a cleaning process is used to remove debris formed from the barrier layer formation shown in FIG. 3.

Although cap layer 46 may be formed without depositing metallic residue upon dielectric layer 34, other residue may be formed upon microelectronic topography 30 during the deposition process. Removal of such residue may be advantageous in some embodiments for the adhesion of subsequent layers. One manner in which to remove the residue is to employ high-pressure, high temperature deionized water based spray 44 as depicted in FIG. 4. The application of such a process may include process parameters similar to the application described above in reference to FIG. 2. In particular, high-pressure, high temperature deionized water based spray 44 may be applied at a pressure greater than approximately 10 psi, at a temperature between approximately 75° C. and approximately 95° C., and at an angle between approximately 10° and approximately 80°. In addition, the deionized water based solution may include a phosphoric acid adsorbent in some embodiments.

Figure 5:
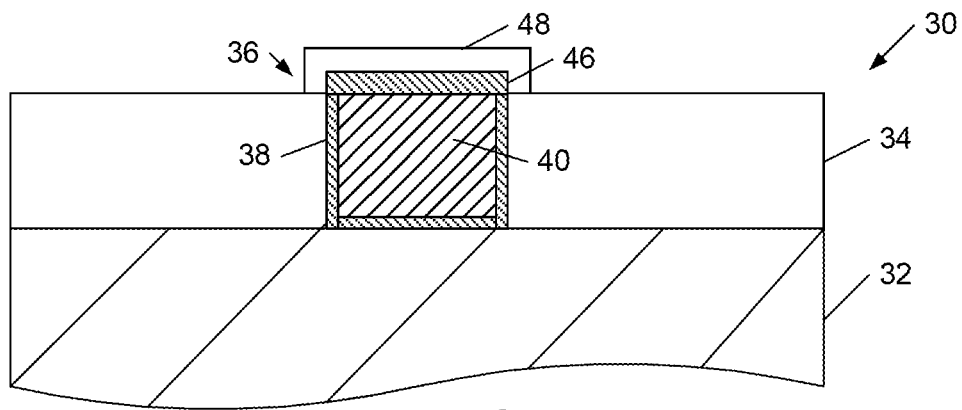
FIG. 5 depicts a partial cross-sectional view of the microelectronic topography in which a protective layer is formed upon the barrier layer subsequent to the removal of debris in FIG. 4.
Figure 6:
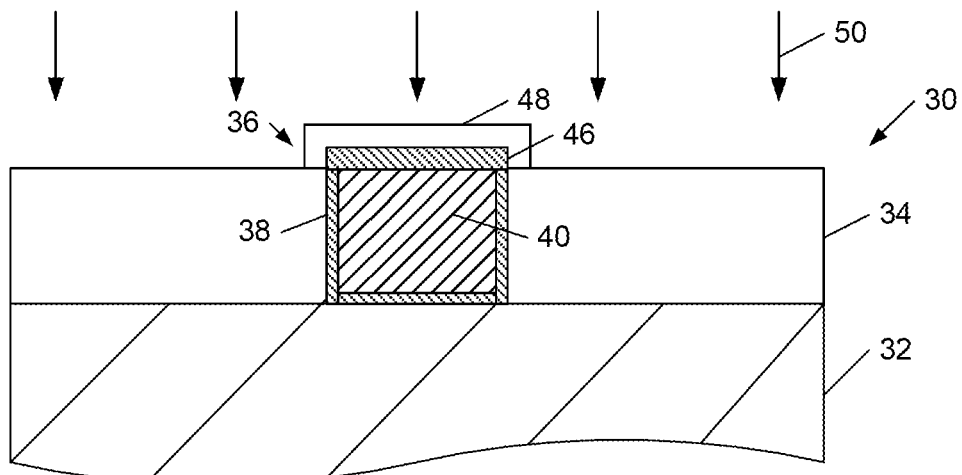
FIG. 6 depicts a partial cross-sectional view of the microelectronic topography in which a cleaning process is used to remove debris formed from the protective layer deposition shown in FIG. 5.

An alternative method for removing residue from microelectronic topography 30 subsequent to the formation of cap layer 46 is to form a dielectric protective layer over cap layer 46 and clean the topography with hydrofluoric acid and/or a brush as illustrated in FIGS. 5 and 6. In particular, FIG. 5 illustrates the formation of dielectric protective layer 48 upon, around, and in contact with cap layer 46. Although dielectric protective layer 48 is described in reference to FIGS. 5 and 6 as being configured to prevent chemical attack of cap layer 46 during a cleaning step, dielectric layer 48 may be additionally configured as an adhesion promoter to subsequently formed overlying layers. In addition or alternatively, dielectric protective layer 48 may be configured to prevent oxidation of the barrier layer. In general, dielectric protective layer 48 may include materials sufficient to perform the aforementioned capabilities, such as but not limited to siloxane, sulfur phosphate and nitrogen phosphate. In addition, dielectric protective layer 48 may include a thickness between approximately one monolayer and tens of angstroms, although larger thicknesses may be used.

In some embodiments, self-assembled deposition techniques using aqueous solutions or vapor phases of trimethylsilylazide (TMSA) or dimethylsulfoxide (DMSO) may be used to fabricate dielectric protective layer 48. Such methods may be advantageous in that they are selective such that a protective layer is only formed upon metallic portions of microelectronic topography 30 and, thus, may be selectively formed exclusively upon cap layer 46. In addition, such methods may be particularly applicable to forming thin protective layers, such as those having a thickness between a monolayer and approximately 5 angstroms. Relatively thin dielectric protective layers may be easier and/or faster to remove during subsequent processing and, therefore, may be advantageous in some embodiments. The self-assembled deposition techniques, however, may be employed to form thicker dielectric protective layers in other embodiments. Furthermore, other deposition techniques may additionally or alternatively be employed to form dielectric protective layer 48 of any thickness.

FIG. 6 illustrates the application of cleaning process 50 which may include exposure to hydrofluoric acid and/or a brush scrub to remove residue upon microelectronic topography 30. In general, parameters of such a cleaning process may be selected from those known in the microelectronic fabrication industry. Due to the inclusion of dielectric protective layer 48, cap layer 46 may be shielded from cleaning process 50 and, therefore, the surface topology of the cap layer may not be altered. In some embodiments, dielectric protective layer 48 may be removed by a plasma or chemical clean, for example, subsequent to cleaning process 50 and prior to any additional fabrication processing. In other embodiments, however, dielectric protective layer 48 may be retained within microelectronic topography 30 during subsequent processing as shown and described below in reference to FIGS. 7-9, for example.

Figure 7:
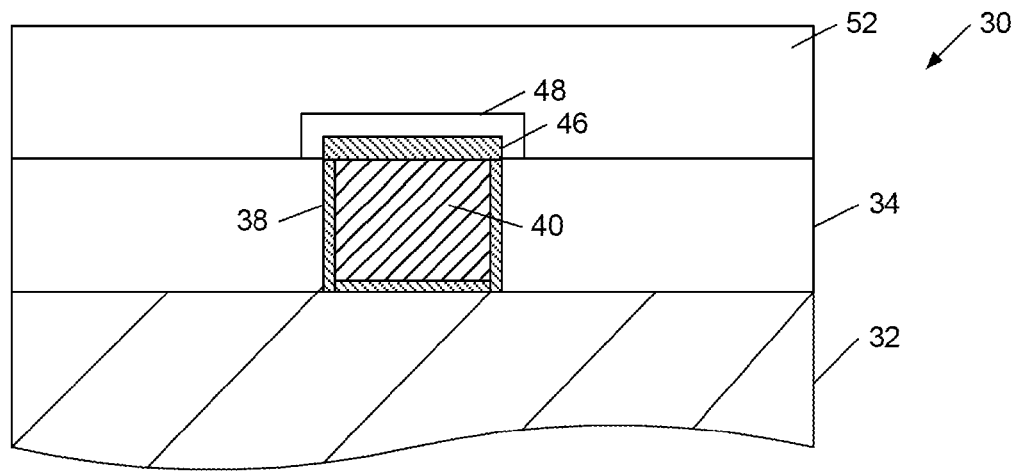
FIG. 7 depicts a partial cross-sectional view of the microelectronic topography in which a dielectric layer is blanket deposited upon topography subsequent to the removal of debris in FIG. 6.

FIG. 7 depicts the formation of dielectric layer 52 upon microelectronic topography 30, or more specifically, upon dielectric layer 34 and dielectric protective layer 48. In general, dielectric layer 52 may serve as an interlevel dielectric and, therefore, may include similar materials as those described for dielectric 34. In particular, dielectric layer 52 may include silicon dioxide ($SiO_2$), silicon nitride ($Si_xN_y$), silicon dioxide/silicon nitride/silicon dioxide (ONO), silicon carbide, carbon-doped $SiO_2$, or carbonated polymers. In some cases, dielectric layer 52 may be doped to form, for example, low doped borophosphorus silicate glass (BPSG), low doped phosphorus silicate glass (PSG), or fluorinated silicate glass (FSG). Alternatively, dielectric layer 52 may include a low-k dielectric material. In some cases, dielectric layer 52 may include the same material as dielectric layer 34. In other embodiments, however, dielectric layers 52 and 34 may include different materials. In any case, dielectric layer 52 may have a thickness between approximately 2,000 angstroms and approximately 10,000 angstroms. Larger or smaller thicknesses of dielectric layer 52, however, may be appropriate depending on the microelectronic device being formed.

Figure 8:
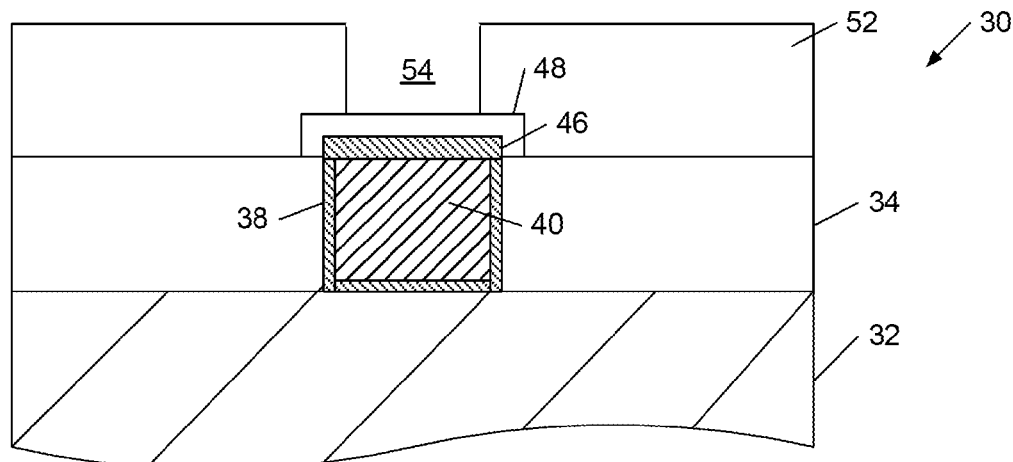
FIG. 8 depicts a partial cross-sectional view of the microelectronic topography in which a trench is etched through the dielectric layer blanket deposited layer in FIG. 7 down to the protective layer disposed above the barrier layer.
Figure 9:
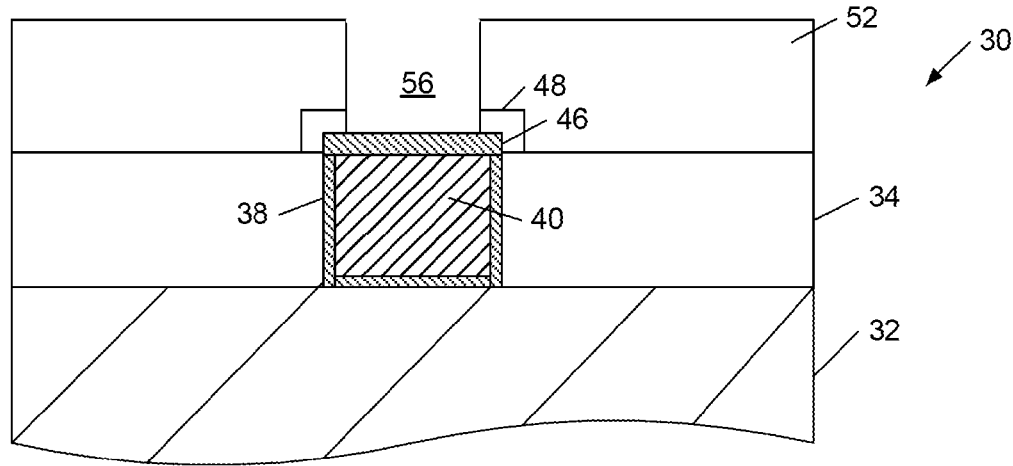
FIG. 9 depicts a partial cross-sectional view of the microelectronic topography in which the trench is further extended through the protective layer subsequent to the trench formation in FIG. 8.

As shown in FIG. 8, trench 54 may be etched into dielectric layer 52 above cap layer 46 and, more specifically, extending down to dielectric protective layer 48. In such a process, dielectric protective layer 48 may serve as an etch stop layer for the formation of trench 54. In particular, dielectric protective layer 48 may include a material which etches at a substantially slower rate than dielectric layer 52 with a given etch chemistry and, therefore, may allow the etch process to be terminated upon or within dielectric protective layer 48. A further etch process may then be employed to remove remaining exposed portions of dielectric protective layer 48 to form trench 56 as shown in FIG. 9. Such an etch process may include parameters such that the material of dielectric protective layer 48 is etched at a faster rate than the material of cap layer 46. In this manner, the etch process may be terminated upon or within an upper surface of cap layer 46. In addition, the etch process parameters may be configured such that dielectric layer 52 is not substantially etched during the process such that the width of the ensuing trench may retained. It is noted that in addition to serving as a shield during cleaning processes and as an etch stop layer, dielectric protective layer 48 may additionally or alternatively serve as a hardmask layer for photolithography processes or a polish stop layer for planarization processes. The use of dielectric protective layer 48 for such applications will generally depend on the design specifications of the device.

Figure 10:
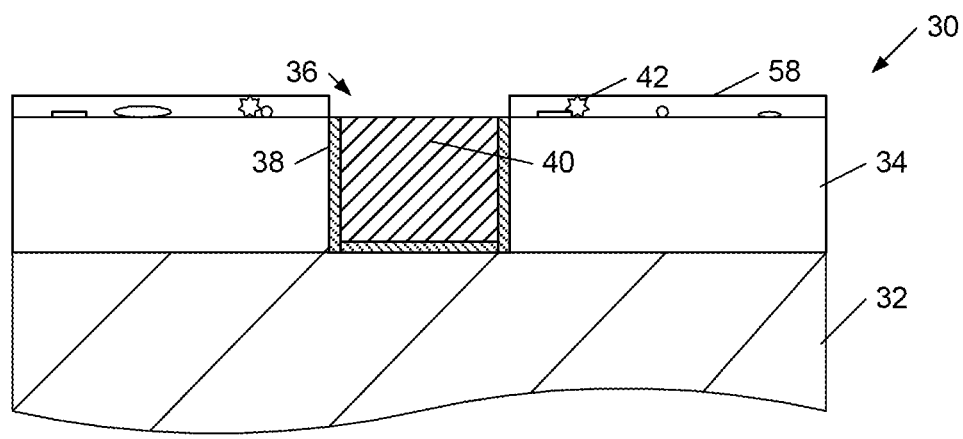
FIG. 10 depicts a partial cross-sectional view of the microelectronic topography in which a protective layer is formed upon the dielectric layer of the topography illustrated in FIG. 1.

An alternative method for processing microelectronic topography 30 prior to and/or subsequent to the formation of cap layer 46 is shown in FIGS. 10-14. In particular, FIG. 10 illustrates the formation of dielectric protective layer 58 upon dielectric layer 34 subsequent to the polishing process described in reference to FIG. 1. As shown in FIG. 10, dielectric protective layer 58 may, in some embodiments, be formed upon metallic residue 42, implying the cleaning process described in reference to FIG. 2 was not performed. In such cases, dielectric protective layer 58 may serve to mask metallic residue 42 such that a subsequent electroless plating process of cap layer 46 may be selective to being deposited upon bulk metal feature 40. In other words, deposition of cap layer 46 above dielectric layer 34 may be avoided and, consequently, shorts to metallic residue 42 may be averted.

As noted above, cap layer 46 may be deposited by deposition techniques other than electroless plating processes in some embodiments. In such cases, isolation of metallic residue 42 by dielectric protective layer 58 may not necessarily be as prudent for preventing the fabrication of shorts within the ensuing device as in embodiments in which cap layer 46 is deposited using electroless plating techniques. Dielectric protective layer 58, however, may, in some embodiments, be used as a hardmask layer, polish stop layer, or an etch stop layer for subsequent processing, regardless of the deposition technique employed for cap layer 46. As such, the fabrication of dielectric protective layer 58 is not necessarily exclusive to embodiments in which cap layer 46 is deposited using electroless plating techniques. In general, dielectric protective layer 58 may include similar materials and characteristics as described above for dielectric protective layer 48. In particular, dielectric protective layer 58 may include materials such as but not limited to siloxane, sulfur phosphate and nitrogen phosphate. In addition, dielectric protective layer 58 may include a thickness between approximately one monolayer and tens of angstroms, although larger thicknesses may be used.

Figure 11:
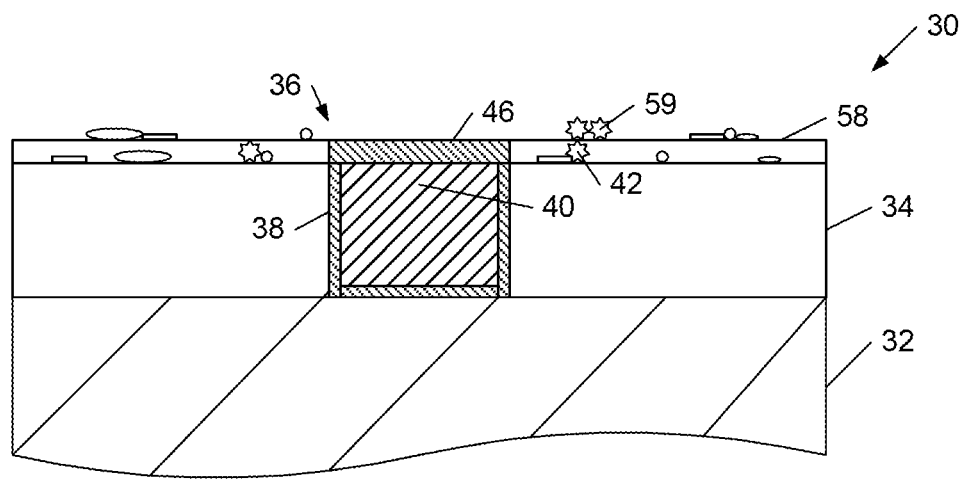
FIG. 11 depicts a partial cross-sectional view of the microelectronic topography in which a barrier layer is formed upon the bulk metal feature subsequent to the formation of the protective layer in FIG. 10.
Figure 12:
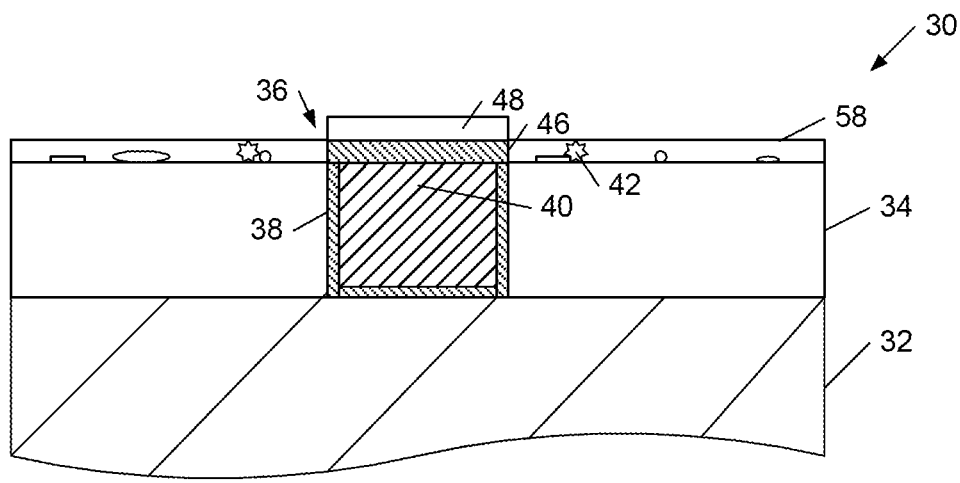
FIG. 12 depicts a partial cross-sectional view of the microelectronic topography in which a protective layer is formed upon the barrier layer subsequent to its formation in FIG. 11.

Turning to FIG. 11, cap layer 46 may be formed upon metallization structure 36. In some embodiments, the formation of cap layer 46 may be similar to the formation of cap layer 46 described in reference to FIG. 3 and, therefore, may either include a selective deposition process or a blanket deposition and subsequent patterning process. In either of such cases, cap layer 46 may be optionally polished to be substantially coplanar with dielectric protective layer 48 as shown in FIG. 11. In other embodiments, cap layer 46 may be formed by a blanket deposition of material and a subsequent polishing process without an intervening photolithography process. In any of such cases (i.e., those which include a polishing process), metallic residue 59 may be formed upon dielectric protective layer 58 as shown in FIG. 11. In some cases, it may be advantageous to remove metallic residue 59 to reduce the likelihood of shorts forming within the ensuing device. In general, metallic residue 59 may be removed by similar processes as described for the removal of metallic residue 42 in reference to FIGS. 4-6. In particular, metallic residue 59 may be removed by either high-pressure, high temperature deionized water based spray 44 or by an application of cleaning process 50 subsequent to the formation of a dielectric protective layer upon cap layer 46. In other embodiments, a polishing process may not be used to form cap layer 46 and, therefore, metallic residue 59 may not be formed upon dielectric protective layer 58 and, consequently, the removal processes described in reference to FIGS. 4-6 may not be necessary. In any case, the topography illustrated in FIG. 12 may result.

Figure 13:
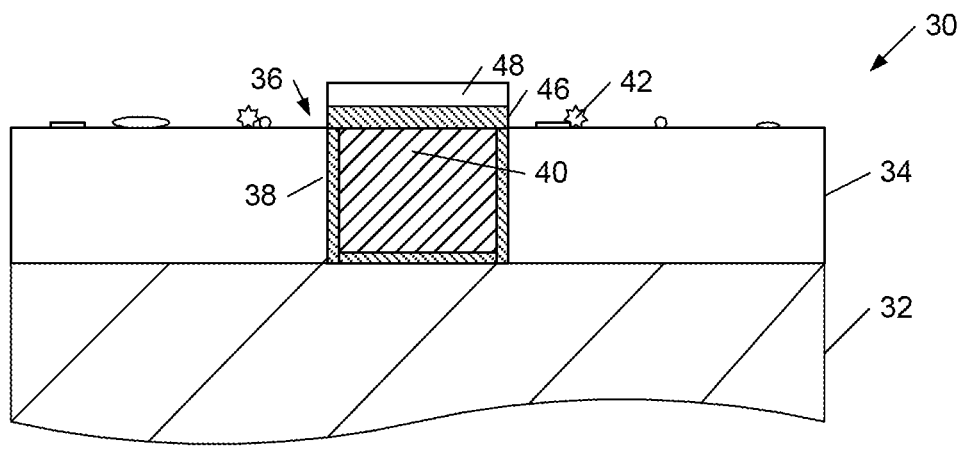
FIG. 13 depicts a partial cross-sectional view of the microelectronic topography in which the protective layer formed upon the dielectric layer is removed subsequent to the formation of the protective layer over the barrier layer in FIG. 12.
Figure 14:
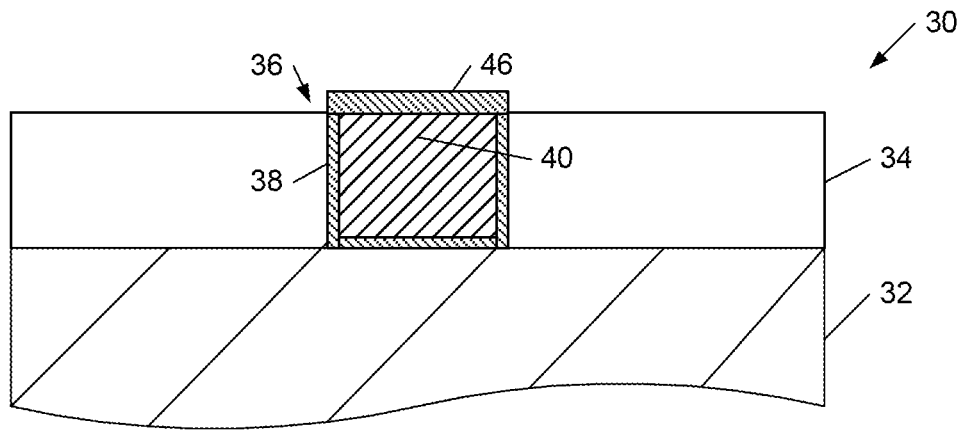
FIG. 14 depicts a partial cross-sectional view of the microelectronic topography in which the protective layer formed upon the barrier layer is removed subsequent to the removal of the protective layer in FIG. 13.

Regardless of whether metallic residue 59 is formed upon dielectric protective layer 58, the fabrication process may, in some embodiments, proceed to the removal of dielectric protective layer 58 and metallic residue 42 as shown and described respectively in reference to FIGS. 13 and 14. In particular, FIG. 13 illustrates the removal of protective dielectric layer 58 and FIG. 14 illustrates the removal of metallic residue 42. FIG. 13 further illustrates the selective deposition of dielectric protective layer 48 upon metallization structure 36. As noted above, the process used for removing metallic residue 42 may be susceptible to etching the material of cap layer 46 and, therefore, it may be advantageous to deposit dielectric protective layer 48 above cap layer 46 prior to the removal of metallic residue 42 in some embodiments. In general, dielectric protective layer 48 may be deposited upon cap layer 42 prior to or subsequent to the removal of dielectric protective layer 58. In some embodiments, however, it may be preferable to form dielectric protective layer 48 prior to the removal of dielectric protective layer 58. In particular, in embodiments in which the formation of dielectric protective layer 48 is selectively deposited upon metal portions of the topography, it may be advantageous to retain dielectric protective layer 58 such that dielectric protective layer 48 is not formed upon metallic particulate 42. The formation of dielectric protective layer 48, however, is not necessarily limited to selective deposition techniques and, therefore, is not necessarily limited to being conducted prior to the removal of dielectric protective layer 58.

In general, dielectric protective layer 48 may include similar materials and characteristics and be formed by similar deposition techniques as described for the layer with the same reference number in reference to FIG. 5. In particular, dielectric protective layer 48 may include materials such as but not limited to siloxane, sulfur phosphate and nitrogen phosphate. In addition, dielectric protective layer 48 may include a thickness between approximately one monolayer and tens of angstroms, although larger thicknesses may be used. In embodiments in which dielectric protective layer 48 is formed prior to the removal of dielectric protective layer 58, dielectric protective layer 48 may include a material with different etch characteristics than dielectric protective layer 58 and/or a thickness greater than dielectric protective layer 58. In this manner, a subsequent removal process of dielectric protective layer 58 may not completely remove dielectric protective layer 48 and expose cap layer 46 to the removal process.

In general, the removal of dielectric protective layer 58 may include but is not limited to a plasma or chemical cleaning process. In some embodiments, the removal of dielectric protective layer 58 may be configured to remove metallic residue 42 as well. In other embodiments, however, some or all of metallic residue 42 may remain upon dielectric layer 34 subsequent to removing dielectric protective layer 58. In such cases, it may be advantageous, in some embodiments, to remove the remaining metallic residue. Exemplary processes for removing metallic particulate 42 are described in reference to FIG. 2. In particular, the removal of metallic particulate 42 may be performed by either high-pressure, high temperature deionized water based spray 44 or by an application of cleaning process 50. In either case, dielectric protective layer 48 may be removed subsequent to the removal of metallic residue 42 as shown in FIG. 14. It is noted that metallic residue 42 and/or 59 do not necessarily need to be removed from microelectronic topography 30 and, therefore, the method described in reference to FIGS. 10-14 may alternatively include the formation of layers and/or structures above any of metallic residue 42, dielectric protective layer 48, dielectric protective layer 58, and/or metallic residue 59.

Figure 15:
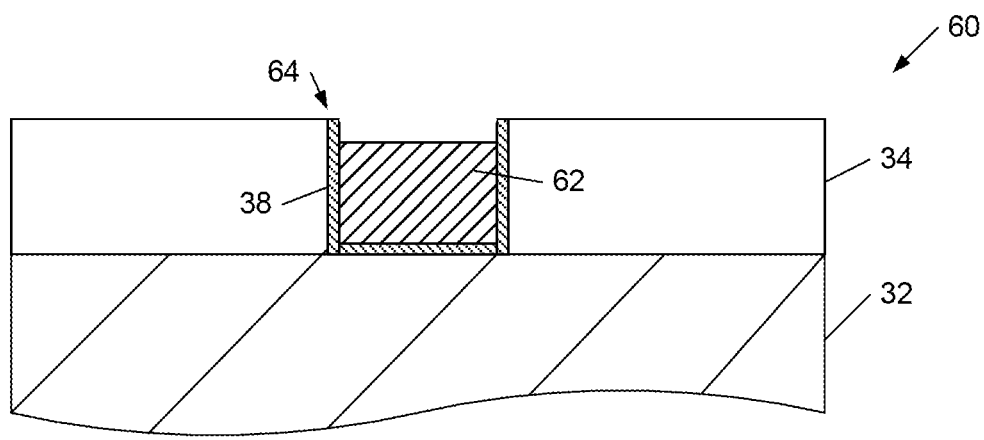
FIG. 15 depicts a partial cross-sectional view of a microelectronic topography in which a bulk metal feature is recessed below an upper surface of an adjacent dielectric layer.

In addition, although the methods described in reference to FIGS. 1-14 are discussed in particular reference to the formation of a metallization structure having a bulk metal feature coplanar with an adjacent dielectric structure, the methods are not necessarily so restricted. In particular, the methods may be applied to any metallization structure, regardless of whether the bulk metal feature is recessed within a trench of the adjacent dielectric layer, coplanar with the adjacent dielectric layer, or has an upper surface at a higher elevation than the adjacent dielectric layer during fabrication. An exemplary alternative configuration of a metallization structure is shown and described in reference to FIGS. 15 and 16. In particular, FIG. 15 depicts microelectronic topography 60 having bulk metal feature 62 of metallization structure 64 formed having an upper surface lower than an upper surface of dielectric layer 34.

In general, the depth to which the upper surface of bulk metal feature 62 is recessed within dielectric layer 34 may depend on the composition and thickness of the ensuing cap layer as well as the areal dimensions of the trench in which the cap layer is formed (i.e., the areal dimensions of the upper surface of bulk metal feature 62). An exemplary range of recess depths may be between approximately 20 angstroms and approximately 50 angstroms. Larger or smaller recess depths, however, may be employed. In any case, the fabrication of bulk metal feature 62 may be formed in a number of different ways. For instance, bulk metal feature 62 may be formed by selective deposition using electroless plating techniques, for example. In other cases, bulk metal feature 62 may be blanket deposited using sputter or evaporation deposition techniques, for example. In either case, the deposition of bulk metal feature 62 may be limited to only filling a partial portion of the trenches within dielectric layer 34. In other embodiments, however, bulk metal feature 62 may be deposited at or above an elevation relative to the upper surface of dielectric layer 34 and subsequently etched back to an elevation below the upper surface of the dielectric layer, such as at the relative elevation shown in FIG. 15, for example.

In general, bulk metal feature 62 may include the same materials and features described above in reference to FIG. 1 for bulk metal feature 40. In particular, bulk metal feature 62 may include one or more layers of conductive materials, including but not limited to copper, aluminum, tungsten, titanium, silver, or any alloy of such metals. In some embodiments, bulk metal feature 62 may be configured to have a majority concentration of copper and, in some cases, consisting essentially of copper, since copper is often favorable to use for metallization structures in microelectronic devices. In addition to bulk metal feature 62, microelectronic topography 50 includes lower layer 32, dielectric layer 34, and liner layer 38 as shown in FIG. 15. In general, the materials and characteristics of such components may be similar to those described for the layers with the same reference numbers in FIG. 1. In addition, the inclusion of liner layer 38 is optional and, therefore, the description of metallization structure 64 is not necessarily limited to the drawing of FIG. 15.

Figure 16:
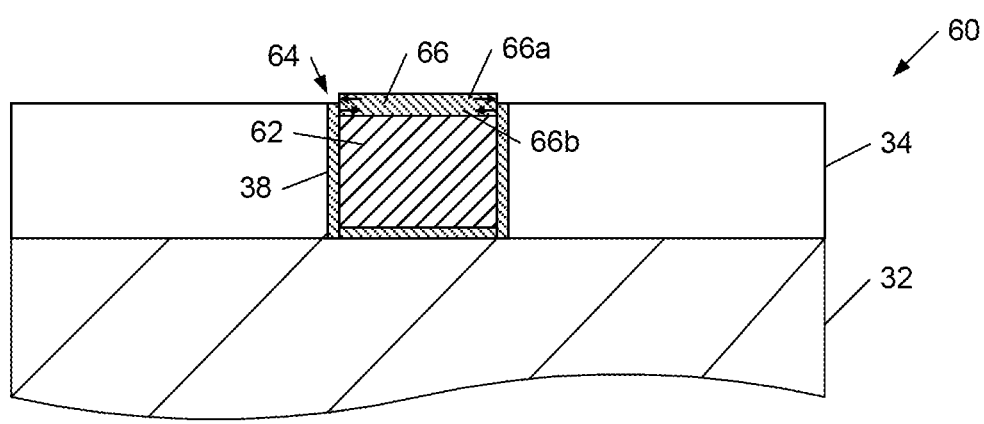
FIG. 16 depicts a partial cross-sectional view of the microelectronic topography in which a barrier layer is formed upon the bulk metal feature of the topography illustrated in FIG. 15.

Subsequent to the formation of bulk metal feature 62, cap layer 66 may be formed upon bulk metal feature 62, becoming an additional component of metallization structure 64 as shown in FIG. 16. In general, cap layer 66 may be formed by any technique known in the microelectronic fabrication industry. In particular, cap layer 66 may, in some embodiments, be formed by blanking depositing a diffusion barrier material upon microelectronic topography 60 and patterning the blanket deposition of material by lithography techniques. Alternatively, cap layer 66 may be selectively deposited upon metallization structure 36 using, for example, electroless plating techniques. In either case, cap layer 66 may be configured to reduce the diffusion of elements from bulk metal feature 62, particularly to any layers formed above bulk metal feature 62. As such, cap layer 66 may generally be referred to as a barrier layer, but such a reference does not necessarily infer the exclusivity of diffusion barrier properties. In particular, cap layer 66 may additionally or alternatively serve as adhesion layers, thermal expansion buffers, and/or to prevent oxidation of metallization structure 64.

In general, cap layer 66 may include similar materials and characteristics as described in reference to FIG. 1 for liner layer 38 and cap layer 46. In particular, the selection and arrangement of the elements included within cap layer 66 may generally depend on the elements included in bulk metal feature 62. For example, in embodiments in which bulk metal feature 62 includes copper, the inclusion of cobalt within cap layer 66 may be particularly beneficial since copper has relatively low solubility with cobalt. Other materials that may be additionally or alternatively included within cap layer 66 may include phosphorus, boron, tungsten, chromium, molybdenum, nickel, palladium, rhodium, ruthenium, hydrogen, and oxygen. Exemplary alloys that may be employed for cap layer 66 include but are not limited to cobalt-tungsten-phosphorus (CoWP), cobalt-tungsten-boron (CoWB), cobalt-tungsten-phosphorus-boron (CoWPB), cobalt-molybdenum-boron (CoMoB), cobalt-molybdenum-phosphorus (CoMoP), cobalt-molybdenum-chromium (CoMoCr), and cobalt-molybdenum-chromium-boron (CoMoCrB). In other embodiments, cap layer 66 may include single element layers of palladium, rhodium and ruthenium.

In some embodiments, cap layer 66 may include a relatively consistent concentration of elements through the layer. In other embodiments, however, cap layer 66 may include a variation of elemental concentrations throughout the layers to reduce the diffusion of elements from metallization structure 64 therethrough. In particular, cap layer 66 may include different concentrations of elements in different regions of the layer. Exemplary elemental compositions of barrier layers having a variation of elemental concentration throughout the layers and methods for depositing such layers are described in U.S. patent application Ser. No. 11/199,620, which was filed on Aug. 9, 2005 and is incorporated by reference as if fully set forth herein. Another exemplary barrier layer having a variation of elemental concentration is described in reference to FIGS. 17 and 18.

Due to bulk metal feature 62 being recessed below the upper surface of dielectric layer 34, a portion of cap layer 66 may be formed below the upper surface of dielectric layer 34. As shown in FIG. 16, cap layer 66 may, in some embodiments, be formed with a portion arranged below the upper surface of dielectric layer 34 and another portion arranged above the upper surface of dielectric layer 34. Such a configuration may advantageously allow cap layer 66 to have a combination of tensile and compressive stresses such that the net stress within the layer is lower than in embodiments in which the entirety of a cap layer is formed above an upper surface of an adjacent dielectric layer or, alternatively, lower than in embodiments in which the cap layer is formed coplanar or below an upper surface of an adjacent dielectric layer. In particular, the configuration of cap layer 66 depicted in FIG. 16 allows the layer to have upper portion 66a under tensile stress since the portion is not bounded by adjacent structures. In addition, cap layer 66 includes lower portion 66*b* under compressive stress since it is bound by adjacent portions of liner layer 38 and dielectric layer 34.

The different types of stresses within upper and lower portions 66*a* and 66*b* are depicted in FIG. 16 by reference arrows denoting the different directions of the stresses innate to each of the portion's configurations. The balance of the stresses between the two portions may be configured to inhibit the formation of hillocks within the cap layer, ensuring the upper surface of cap layer 66 is substantially planar. In addition, the balance of stresses may be configured to prevent delamination of cap layer 66 from bulk metal feature 62 as well as prevent the cap layer from extending out over portions of dielectric layer 34. In some cases, the stresses among upper and lower portions 66*a* and 66*b* may be equalized to accomplish such objectives. In other embodiments, however, the net stress among upper and lower portions 66*a* and 66*b* may be slightly tensile or slightly compressive and still realize such benefits.

In general, the net stress within a layer may depend on the material compositions, relative thicknesses, and areal dimensions of the layer as well as surrounding structures and layers. In particular, different materials tend to exhibit different degrees of stress for a given thickness and given occupied area. As such, not only does the degree of tensility and compressibility of upper and lower portions 66*a* and 66*b* respectively depend on the material compositions, thicknesses, and areal dimensions of such portions, the degree of stress also depends on such properties of dielectric layer 34, liner layer 38, and bulk metal feature 62. Consequently, the minimization of stress differences and/or equalization of stress between upper and lower portions 66*a* and 66*b* may not necessarily be restricted to the portions having the same materials and/or having the same thicknesses. In particular, upper and lower portions 66*a* and 66*b* may include different materials and/or thicknesses in some embodiments. Alternatively, upper and lower portions 66*a* and 66*b* may include the same materials and/or the same thicknesses.

As noted above, an exemplary range of recess depths to which the upper surface of bulk metal feature 62 may be recessed within dielectric layer 34 may be between approximately 20 angstroms and approximately 50 angstroms, although larger or smaller recess depths may be employed. As such, an exemplary range of thickness for lower portion 66*b* may be between approximately 20 angstroms and approximately 50 angstroms, although larger or smaller thicknesses may be employed. In some cases, an exemplary range of thickness for upper portion 66*a* may also be between approximately 20 angstroms and approximately 50 angstroms, although larger or smaller thicknesses may be employed.

Figure 17:
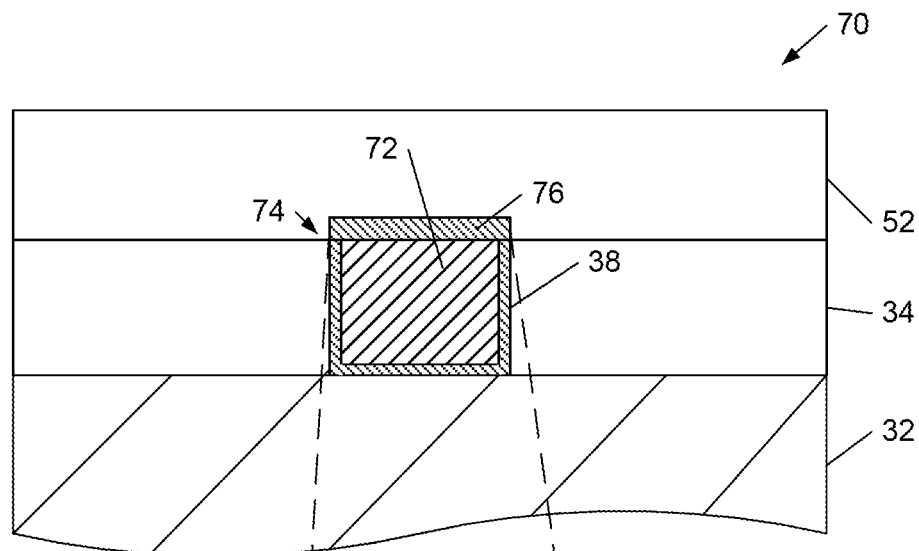
FIG. 17 depicts a partial cross-sectional view of a microelectronic topography having a metallization structure with a barrier layer.
Figure 18:
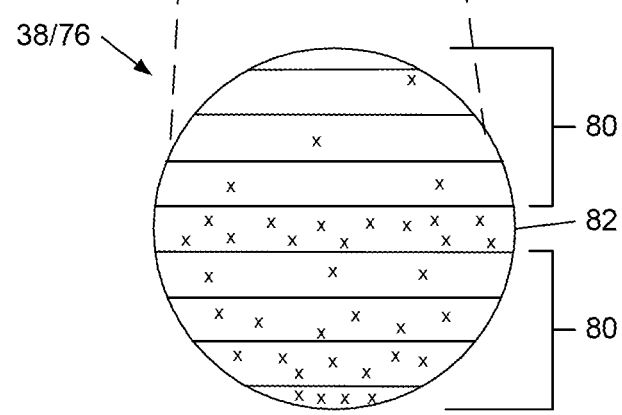
FIG. 18 depicts a magnified view of a composition of at least one element within the barrier layer.

As noted above, a configuration of a barrier layer having a variation of elemental concentrations is shown and described in reference to FIGS. 17 and 18. In particular, FIG. 17 illustrates a cross-section of microelectronic topography 70 having metallization structure 74 disposed above lower layer 32, interposed within dielectric layer 34, and covered by dielectric layer 52. As shown in FIG. 17, metallization structure 74 may include liner layer 38, bulk metal feature 72, and cap layer 76. In general, lower layer 32, dielectric layers 34 and 52, and liner layer 38 may include any of the materials and characteristics described for layers of the same reference numbers in FIGS. 1 and 7. In addition, bulk metal feature 72 and cap layer 76 may include any of the materials and characteristics respectively described for bulk metal features 40 and 62 and cap layer 46 and 66 in reference to FIGS. 1, 3, 15 and 16.

Furthermore, bulk metal feature 72 and cap layer 76 may include either of the configurations described for such structures in reference to FIGS. 1, 3, 15 and 16. In particular, bulk metal feature 72 may be formed with an upper surface recessed at an elevation below the upper surface of dielectric layer 34 or, alternatively, with an upper surface formed coplanar with the upper surface of dielectric layer 34. In addition, cap layer 76 may be configured with a lower surface coplanar with the upper surface of dielectric layer 34 or, alternatively, may include portions extending to elevations below and above the upper surface of dielectric layer 34. In yet other embodiments, the entirety of cap layer 76 may be arranged at an elevation below an upper surface of dielectric layer 34 or an upper surface of bulk metal feature 72 may be arranged at an elevation above an upper surface of dielectric layer 34. In any case, the configuration of bulk metal feature 72 and cap layer 76 is not necessarily restricted to the illustration in FIG. 17.

It is further noted that microelectronic topography 70 is not necessarily limited to having both liner layer 38 and cap layer 76. In particular, microelectronic topography 70 may alternatively include only one of liner layer 38 and cap layer 76. Moreover, the barrier layer configuration described in reference to FIG. 18 may be applied to either or both of such layers. As such, FIG. 18 is referenced as "38/76," denoting the elemental distributions of liner layer 38 and/or cap layer 76. In addition, it is noted that microelectronic topography 70 may include additional layers and/or structures formed above dielectric layer 52. Consequently, the barrier layer configuration described in reference to FIG. 18 is not limited to an intermediate fabrication topography.

As shown in FIG. 18, liner layer 38 and/or cap layer 76 may include a plurality of metal alloy layers 80. In some embodiments, the plurality of metal alloy layers 80 may each include a metal constituent majority different than bulk metal feature 72. The term "metal constituent majority" may generally refer to the metal element having the bulk concentration within the layer. For example, an alloy of CoWPB may, in some embodiments, have a bulk concentration of cobalt and, therefore, may have a metal constituent majority of cobalt. Although the plurality of metal alloy layers 80 may include some of the elements which are included in bulk metal feature 72, the metal alloy layers do not include a bulk concentration of the same element as having the bulk concentration within bulk metal feature 72. Consequently, the plurality of metal alloy layers 80 may each include a metal constituent majority different than bulk metal feature 72. In some embodiments, the plurality of metal alloy layers 80 may include the same metal constituent majority. In other embodiments, however, one or more of the plurality of metal alloy layers 80 may include a different metal constituent majority.

In any case, the plurality of metal alloys 80 may include any of the materials and characteristics described above for liner layer 38 and cap layers 46 and 66 as well as traces of elements from bulk metal feature 72 due to diffusion of such elements therefrom. The term "alloy" may generally refer to a mixture of metal elements, but not necessarily in any fixed proportion. As such, although one or more of metal alloy layers 80 may include the same elements, the concentrations of such elements may not necessarily be similar. In other embodiments, the plurality of metal alloy layers 80 may not include the same elements.

In addition to having metal alloy layers 80, liner layer 38 and/or cap layer 76 may include metal-oxide compound layer 82 interposed between two of the metal alloy layers. The term "metal-oxide compound," as used herein, may generally refer to a substance having a collection of metal and oxygen atoms bonded to each other in fixed proportions. For example, metal-oxide compound layer 82 may include compounds of cobalt-oxide, nickel-oxide, iron-oxide, molybdenum-oxide, tungsten-oxide, or any transition metal oxide. In some embodiments, metal-oxide compound layer 82 may include a contiguous layer comprising a single type of metal-oxide compounds. In other embodiments, however, metal-oxide compound layer 82 may include a plurality of layers of different types of metal oxide compounds. In addition to metal-oxide compounds, metal-oxide compound layer 82 and at least some of the plurality of metal alloy layers 80 may include one or more of the elements included within bulk metal feature 72 due to the diffusion of such elements from the feature. For example, metal-oxide compound layer 82 and at least some of the plurality of metal alloy layers 80 may include copper in embodiments in which bulk metal feature 72 comprises copper.

In some embodiments, metal-oxide compound layer 82 may include a concentration of an element which is disproportionate relative to concentrations of the element within the plurality of metal alloy layers 80. In particular, metal-oxide compound layer 82 may include an elemental concentration which differs from a distribution pattern of concentrations of such an element among successions of metal alloy layers 80 on either side of metal-oxide compound layer 82. More specifically, metal-oxide compound layer 82 may include an elemental concentration which is substantially higher or lower than what may be anticipated based upon the distribution of concentrations of the element within metal alloy layers 80 on either side of metal-oxide compound layer 82. For example, in embodiments in which the barrier layer configuration is formed for cap layer 76, if metal alloy layers 80 interposed between bulk metal feature 72 and metal-oxide compound layer 82 include successively decreasing concentrations of an element, metal-oxide compound layer 82 may include a concentration of the element which is higher than the metal alloy directly adjacent to the compound layer. In this manner, the elemental concentration within metal-oxide compound layer 82 will differ from the distribution of elemental concentrations within the metal alloy layers of the barrier layer and, consequently, include an elemental concentration which is disproportionate relative to concentrations of the element within the plurality of metal alloy layers 80.

The disproportionate elemental concentration within metal-oxide compound layer 82 may be due to the configuration of the layer to getter or repel one or more elements diffused from bulk metal feature 72. For example, metal-oxide compound layer 82 may include compounds of cobalt-oxide, nickel-oxide, and/or iron-oxide to getter copper from metal alloy layers 80. Alternatively, compounds of molybdenum-oxide or tungsten-oxide may serve as an anti-getter of copper from metal alloy layers 80. As such, the distribution of elemental concentrations within metal alloy layers 80 on either side of metal-oxide compound layer 82 may depend on the composition of metal-oxide compound layer 82 as well as the position of the barrier layer relative to bulk metal feature 72, the diffusion properties of the element diffused from bulk metal feature 72, and the composition of the metal alloy layers.

In particular, having gettering materials within metal-oxide compound layer 82 will attract copper atoms from metal alloy layers 80 interposed between the metal-oxide compound layer and bulk metal feature 72 and inhibit copper atoms from diffusing to layers above/below metal-oxide compound layer 82 (i.e., above for embodiments in which the barrier layer configuration is applied to cap layer 76 and below for embodiments in which the configuration is applied to liner layer 38). In contrast, having anti-gettering materials within metal-oxide compound layer 82 will inhibit copper atoms from diffusing therein from metal alloy layers 80 interposed between the metal-oxide compound layer and bulk metal feature 72 and, consequently, further inhibit copper atoms from diffusing to layers above/below metal-oxide compound layer 82. As a consequence, concentrations of an element within successive layers of metal alloy layers 80 may, in some embodiments, steadily or erratically increase or steadily or erratically decrease, depending on the gettering or anti-gettering properties of metal-oxide composition layer.

In addition, the concentration of the element within metal-oxide compound layer 82 may be disproportionate from the distribution of the element within successive layers of metal alloy layers 80. In particular, in embodiments in which the barrier layer configuration is formed for cap layer 76, if the metal alloy layers 80 interposed between bulk metal feature 72 and metal-oxide compound layer 82 include successively increasing concentrations of an element, metal-oxide compound layer 82 may include a concentration of the element which is lower than the metal alloy directly adjacent to the compound layer. Conversely, if the metal alloy layers 80 interposed between bulk metal feature 72 and metal-oxide compound layer 82 include successively decreasing concentrations of an element, metal-oxide compound layer 82 may include a concentration of the element which is higher than the metal alloy directly adjacent to the compound layer. FIG. 18 illustrates an exemplary concentration distribution of element "X" representative of the latter case. In particular, FIG. 18 illustrates metal-oxide compound layer 82 having a concentration of "X" atoms which is significantly higher than the concentration of such an element within succession of metal alloy layers 80 on either side of metal-oxide layer 82.

The disproportionate elemental concentration within metal-oxide compound layer 82 may be fabricated by annealing microelectronic topography 70 subsequent to the formation of the barrier layer. The anneal process may be conducted at a temperature of at least 150° C., and more specifically between approximately 300° C. and approximately 800° C. In addition, the anneal process may be conducted for any length of time. A duration of at least approximately 10 minutes, however, may be particularly advantageous. For example, the anneal process may be conducted for a time period up to approximately 2 hours in some embodiments. It is noted that although the barrier layer configuration illustrated in FIG. 18 is shown only having one metal-oxide compound layer, the barrier layer may have multiple metal-oxide compound layers separated by different layers of metal alloy layers 80. As such, the barrier layer configuration is not necessarily limited to the illustration of FIG. 18. In any case, the thickness of metal-oxide compound layer 82 may be between approximately 0.5 nm and approximately 2 nm and, in some embodiments, approximately 1 nm, but larger or smaller thicknesses may be employed.

It will be appreciated to those skilled in the art having the benefit of this disclosure that this invention is believed to provide improved configurations of barrier layers and methods for processing microelectronic topographies having barrier layers. Further modifications and alternative embodiments of various aspects of the invention will be apparent to those skilled in the art in view of this description. For example, although the deposition processes specifically electroless plating techniques, the barrier layer configurations and methods of fabrication are not necessarily so limited. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A microelectronic topography, comprising:
   a bulk metal feature;
   a dielectric layer arranged adjacent to opposing sidewalls of the bulk metal feature, wherein the dielectric layer comprises an upper surface at an elevation between 20 angstroms and 50 angstroms higher than an upper surface of the bulk metal feature; and
   a diffusion barrier layer formed upon and in contact with the upper surface of the bulk metal feature but not upon the dielectric layer, wherein the diffusion barrier layer extends to an elevation between 20 angstroms and 50 angstroms higher than the upper surface of the dielectric layer, and wherein the diffusion barrier layer comprises cobalt.

2. The microelectronic topography of claim 1, wherein the upper surface elevation of the dielectric layer relative to the upper surface of the bulk metal feature and the upper surface elevation of the diffusion barrier layer relative to the upper surface of the dielectric layer are configured to induce a balance of tensile and compressive stresses within the diffusion barrier layer.

3. The microelectronic topography of claim 1, wherein the upper surface of the dielectric layer is formed at an elevation between 20 angstroms and 40 angstroms higher than the upper surface of the bulk metal feature.

4. The microelectronic topography of claim 1, wherein the upper surface of the diffusion barrier layer is formed at an elevation between 20 angstroms and 40 angstroms higher than the upper surface of the dielectric layer.

5. The microelectronic topography of claim 1, wherein the bulk metal feature comprises copper.

6. The microelectronic topography of claim 1, wherein a lower region of the diffusion barrier layer extending from a lower surface of the diffusion barrier layer to an elevation substantially coplanar with the upper surface of the dielectric layer comprises a thickness equal to the thickness of an upper region of the diffusion barrier layer extending from an upper surface of the diffusion barrier layer to the elevation substantially coplanar with the upper surface of the dielectric layer.

7. The microelectronic topography of claim 1, wherein a lower region of the diffusion barrier layer extending from a lower surface of the diffusion barrier layer to an elevation substantially coplanar with the upper surface of the dielectric layer is thicker than an upper region of the diffusion barrier layer extending from an upper surface of the diffusion barrier layer to the elevation substantially coplanar with the upper surface of the dielectric layer.

8. The microelectronic topography of claim 1, wherein a lower region of the diffusion barrier layer extending from a lower surface of the diffusion barrier layer to an elevation substantially coplanar with the upper surface of the dielectric layer is thinner than an upper region of the diffusion barrier layer extending from an upper surface of the diffusion barrier layer to the elevation substantially coplanar with the upper surface of the dielectric layer.

9. The microelectronic topography of claim 1, wherein a lower region of the diffusion barrier layer extending from a lower surface of the diffusion barrier layer to an elevation substantially coplanar with the upper surface of the dielectric layer comprises a different material than an upper region of the diffusion barrier layer extending from an upper surface of the diffusion barrier layer to the elevation substantially coplanar with the upper surface of the dielectric layer.

10. The microelectronic topography of claim 1, wherein a lower region of the diffusion barrier layer extending from a lower surface of the diffusion barrier layer to an elevation substantially coplanar with the upper surface of the dielectric layer comprises substantially the same material as an upper region of the diffusion barrier layer extending from an upper surface of the diffusion barrier layer to the elevation substantially coplanar with the upper surface of the dielectric layer.

11. The microelectronic topography of claim 1, wherein the diffusion barrier layer is a material selected from the group consisting of cobalt-tungsten-phosphorus (CoWP), cobalt-tungsten-boron (CoWB), cobalt-tungsten-phosphorus-boron (CoWPB), cobalt-molybdenum-boron (CoMoB), cobalt-molybdenum-phosphorus (CoMoP), cobalt-molybdenum-chromium (CoMoCr), and cobalt-molybdenum-chromium-boron (CoMoCrB).

12. A microelectronic topography, comprising:
   a single layer bulk metal feature;
   a single layer diffusion barrier abutting sidewalls and a bottom surface of the bulk metal feature;
   a dielectric layer abutting opposing sidewalls of the single layer diffusion barrier, wherein the dielectric layer comprises an upper surface at an elevation between 20 angstroms and 50 angstroms higher than an upper surface of the bulk metal feature; and
   a cap diffusion barrier formed upon and in contact with the upper surface of the bulk metal feature but not upon the dielectric layer, wherein the diffusion barrier layer extends to an elevation between 20 angstroms and 50 angstroms higher than the upper surface of the dielectric layer.

13. The microelectronic topography of claim 12, wherein the single layer diffusion barrier and the cap diffusion barrier comprise the same materials.

14. The microelectronic topography of claim 12, wherein the single layer diffusion barrier and the cap diffusion barrier comprise different materials.

15. The microelectronic topography of claim 12, wherein at least one of the single layer diffusion barrier and the cap diffusion barrier comprises cobalt.

16. The microelectronic topography of claim 12, wherein at least one of the single layer diffusion barrier and the cap diffusion barrier comprises palladium, rhodium or ruthenium.

17. A microelectronic topography, comprising:
   a bulk metal feature;
   a dielectric layer arranged adjacent to opposing sidewalls of the bulk metal feature, wherein the dielectric layer comprises an upper surface at an elevation higher than an upper surface of the bulk metal feature; and
   a diffusion barrier layer arranged upon and in contact with the upper surface of the bulk metal feature but not upon the dielectric layer, wherein diffusion barrier layer comprises:
      a lower region vertically extending from a lower surface of the diffusion barrier layer to an elevation substantially coplanar with the upper surface of the dielectric layer; and
      an upper region vertically extending from the elevation substantially coplanar with the upper surface of the dielectric layer to an upper surface of the diffusion barrier layer, wherein the upper region comprises a different material than the lower region and/or the lower region comprises a different material than the upper region.

18. The microelectronic topography of claim 17, wherein the upper region comprises a thickness equal to the thickness of the lower region.

19. The microelectronic topography of claim 17, wherein the upper region is thinner than the lower region.

20. The microelectronic topography of claim 17, wherein the upper region is thicker than the lower region.

* * * * *